United States Patent
Tsai

(10) Patent No.: US 7,889,825 B2
(45) Date of Patent: Feb. 15, 2011

(54) METHODS FOR ADJUSTING SAMPLING CLOCK OF SAMPLING CIRCUIT AND RELATED APPARATUSES

(75) Inventor: Ming-Lun Tsai, Kao-Hsiung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 979 days.

(21) Appl. No.: 11/733,775

(22) Filed: Apr. 11, 2007

(65) Prior Publication Data

US 2007/0237276 A1 Oct. 11, 2007

(30) Foreign Application Priority Data

Apr. 11, 2006 (TW) .............................. 95112850 A

(51) Int. Cl.
*H04L 7/00* (2006.01)
(52) U.S. Cl. ...................................... 375/355; 375/371
(58) Field of Classification Search .................. 375/355, 375/354, 359, 371; 348/500, 536, 537; 341/126, 341/155; 345/30, 55, 84, 87, 98, 99, 204, 345/211, 213
See application file for complete search history.

(56) References Cited

U.S. PATENT DOCUMENTS

| 5,774,499 | A | 6/1998 | Ahn |
| 6,097,444 | A | 8/2000 | Nakano |
| 6,268,848 | B1 | 7/2001 | Eglit |
| 6,314,133 | B1 | 11/2001 | Kakura |
| 6,522,282 | B1 * | 2/2003 | Elbornsson ................. 341/155 |
| 6,686,969 | B1 * | 2/2004 | Hara et al. .................. 348/537 |
| 6,700,570 | B2 * | 3/2004 | Tachibana et al. ........... 345/213 |
| 6,853,616 | B1 | 2/2005 | Kim |
| 2006/0056558 | A1 * | 3/2006 | Chou et al. ................. 375/355 |

FOREIGN PATENT DOCUMENTS

| CN | 1431659 A | 7/2003 |
| DE | 195 31 818 C1 | 10/1996 |
| WO | 99/59391 | 11/1999 |

* cited by examiner

*Primary Examiner*—David C Payne
*Assistant Examiner*—Vineeta S Panwalkar
(74) *Attorney, Agent, or Firm*—Winston Hsu; Scott Margo

(57) ABSTRACT

Methods for adjusting a sampling clock of a sampling circuit and related apparatuses are disclosed. One proposed method includes: calculating difference between adjacent sampled values, generated from the sampling circuit by sampling an incoming signal based on the sampling clock, to obtain a plurality of differences; performing a predetermined calculation on the differences to generate a calculated value, the differences including a first difference with a first absolute value and a second difference with a second absolute value less than the first absolute value, and the predetermined calculation causing that a ratio of component of the calculated value contributed by the first difference to component of the calculated value contributed by the second difference to be greater than a ratio of the first absolute value to the second absolute value; and adjusting phase of the sampling clock so that the calculated value generated by the predetermined calculation satisfies predetermined conditions.

20 Claims, 3 Drawing Sheets

METHODS FOR ADJUSTING SAMPLING CLOCK OF SAMPLING CIRCUIT AND RELATED APPARATUSES

BACKGROUND OF THE INVENTION

1. Field of the Invention

The present disclosure relates to signal sampling techniques, and more particularly, to methods for adjusting a sampling clock of a sampling circuit and related apparatuses.

2. Description of the Prior Art

For a sampling circuit, such as an analog-to-digital converter (ADC), the phase selection mechanism of the sampling clock has a significant influence to the quality of sampled data. For example, in a liquid crystal display (LCD) device, an ADC is typically employed to sample an analog image signal according to a sampling clock to generate required digital image data. If the phase of the sampling clock of the ADC is selected improperly, the image quality of the output signal is easily degraded. Therefore, an auto phase setting technique is usually applied in LCD devices to adjust the phase of the sampling clock of the ADC.

The conventional approach for deciding the phase of the sampling clock of the ADC is to calculate the sum of absolute difference (SAD) of sampled data output from the ADC with respect to different candidate sampling phases. Then, multiple SADs corresponding to different candidate sampling phases are compared to identify a sampling phase corresponding to the maximum SAD as the best sampling phase for the ADC. However, this approach is not considered accurate. For example, the sampling phase selected is usually far from ideal if the image in nature is composed of numerous stripes, thereby resulting in a degradation of image quality.

SUMMARY OF THE INVENTION

It is therefore an objective of the present disclosure to provide methods for adjusting a sampling clock of a sampling circuit and related apparatuses to solve the above-mentioned problems.

An exemplary embodiment of a sampling clock adjusting device of a sampling circuit is disclosed comprising: a difference calculator coupled to the sampling circuit for calculating difference between adjacent sampled values of a plurality of sampled values, which are generated from the sampling circuit by sampling an incoming signal based on a sampling clock, to obtain a plurality of differences; a computing unit coupled to the difference calculator for generating a calculated value according to the plurality of differences, which include a first difference with a first absolute value and a second difference with a second absolute value less than the first absolute value, the computing unit causing that a ratio of component of the calculated value contributed by the first difference to component of the calculated value contributed by the second difference to be greater than a ratio of the first absolute value to the second absolute value; and an adjusting circuit coupled to the computing unit and the sampling circuit for adjusting phase of the sampling clock so that the calculated value generated by the computing unit satisfies a predetermined condition.

An exemplary embodiment of a method for adjusting a sampling clock of a sampling circuit is disclosed comprising: calculating difference between adjacent sampled values of a plurality of sampled values, which are generated from the sampling circuit by sampling an incoming signal based on the sampling clock, to obtain a plurality of differences; performing a predetermined calculation on the plurality of differences to generate a calculated value, the plurality of differences including a first difference with a first absolute value and a second difference with a second absolute value less than the first absolute value, and the predetermined calculation causing that a ratio of component of the calculated value contributed by the first difference to component of the calculated value contributed by the second difference to be greater than a ratio of the first absolute value to the second absolute value; and adjusting phase of the sampling clock so that the calculated value generated by the predetermined calculation satisfies a predetermined condition.

An exemplary embodiment of an analog-to-digital converting module capable of adaptively adjusting phase of a sampling clock is disclosed comprising: an analog-to-digital converter (ADC) for sampling an incoming signal according to the sampling clock to generate a plurality of sampled values; a difference calculator coupled to the ADC for calculating difference between adjacent sampled values to generate a plurality of differences; a computing unit coupled to the difference calculator for generating a calculated value according to the plurality of differences, which include a first difference with a first absolute value and a second difference with a second absolute value less than the first absolute value, the computing unit causing that a ratio of component of the calculated value contributed by the first difference to component of the calculated value contributed by the second difference to be greater than a ratio of the first absolute value to the second absolute value; and an adjusting circuit coupled to the computing unit and the ADC for adjusting the phase of the sampling clock so that the calculated value generated by the computing unit satisfies a predetermined condition.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
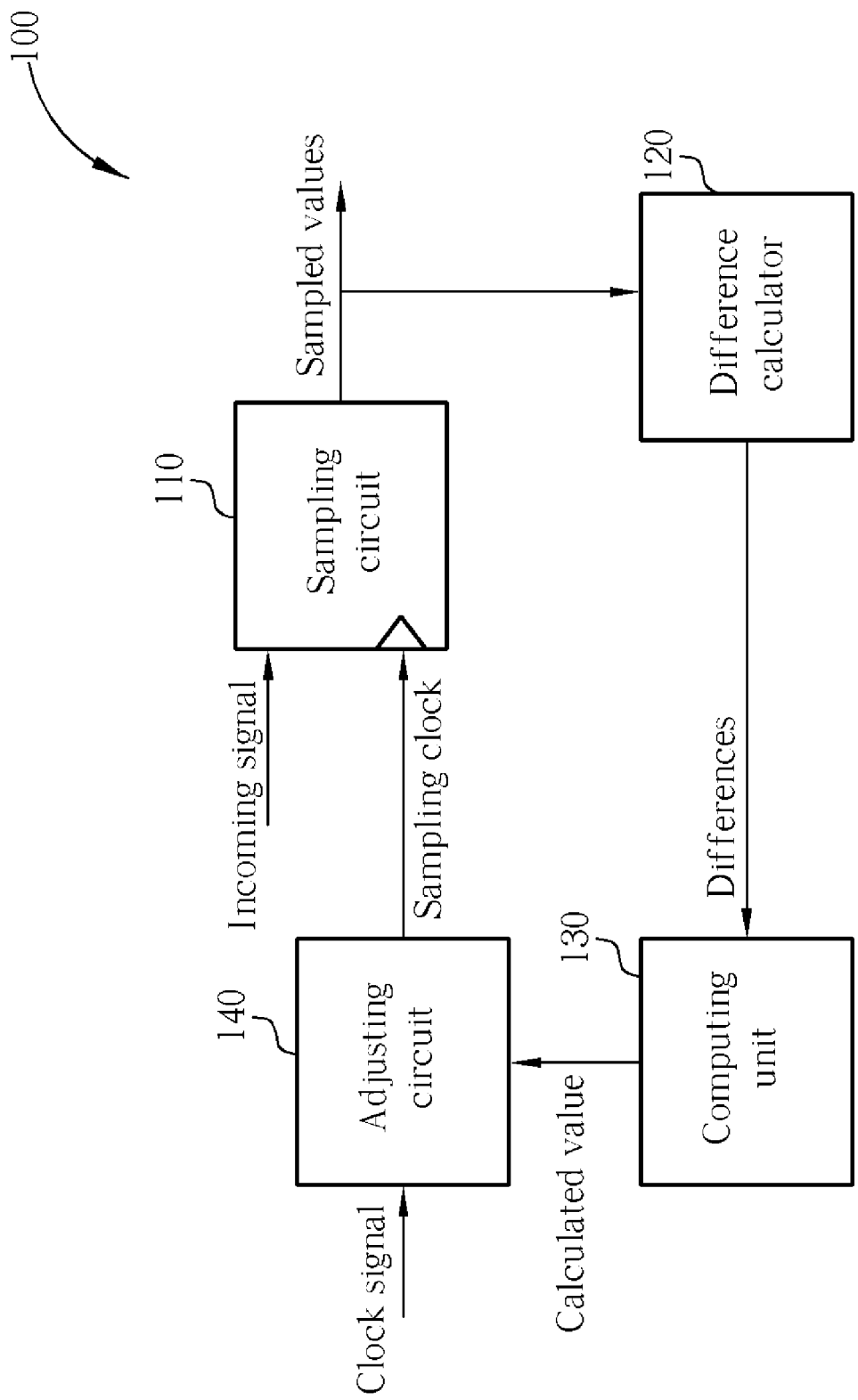
FIG. 1 is a block diagram of an analog-to-digital converting module according to an exemplary embodiment of the present invention.

Please refer to FIG. 1, which shows a block diagram of an analog-to-digital converting module 100 according to an exemplary embodiment of the present invention. As shown, the analog-to-digital converting module 100 comprises a sampling circuit 110, a difference calculator 120, a computing unit 130, and an adjusting circuit 140. In this embodiment, the combination of the difference calculator 120, the computing unit 130, and the adjusting circuit 140 is employed to adjust the phase of a sampling clock of the sampling circuit 110, and such combination can be regarded as a sampling clock adjusting device of the sampling circuit 110. For the purpose of explanatory convenience in the following description, it is assumed herein that the analog-to-digital converting module 100 is applied in an LCD device to convert analog incoming image signals into digital image data. Hereinafter, operations and implementations of respective components of the analog-to-digital converting module 100 will be explained in more detail.

In operations, the sampling circuit 110 samples an incoming signal according to a sampling clock to generate a plurality of sampled values. The difference calculator 120 calculates difference between adjacent sampled values to generate a plurality of differences. The computing unit 130 then performs a predetermined calculation on the plurality of differences generated by the difference calculator 120 to generate a calculated value. In practice, the sampling circuit 110 may be an analog-to-digital converter (ADC), and the difference calculator 120 may be implemented with a subtracter.

Please note that, one technical feature of this embodiment is that the predetermined calculation will cause the ratio of the proportion of the calculated value contributed by a first difference to the proportion contributed by the second difference to be greater than the ratio of the first absolute value to the second absolute value, wherein the absolute value of the first difference is greater than the absolute value of the second difference. For example, suppose that the first difference is −15, and the second difference is 5. In this case, the absolute value of the first difference is 15 and the absolute value of the second difference is 5, so the ratio of the absolute value of the first difference to the absolute value of the second difference is 3. It should be appreciated by those skilled in the art that when generating a sum of absolute difference (SAD) of the plurality of differences by the difference calculator 120, the ratio of component contributed by the first difference to component contributed by the second difference is 15:5, which is the same as the ratio of their absolute values. However, the predetermined calculation weights the first difference (−15) and the second difference (5), such that the resultant ratio is greater than that of their respective absolute values (3).

For example, in a preferred embodiment, the computing unit 130 computes a sum of squares of the plurality of differences generated by the difference calculator 120 to generate the calculated value. As a result, the ratio of the proportion contributed by the first difference (−15) to the proportion contributed by the second difference (5) is $(-15)^2:(5)^2=9$, which is greater than the ratio of their respective absolute values 3. Such a procedure is appropriate for amplifying the contribution of the proportion derived from a difference having a relatively greater absolute value while not neglecting the contribution of the proportion derived from a difference having a relatively smaller absolute value.

Figure 2:
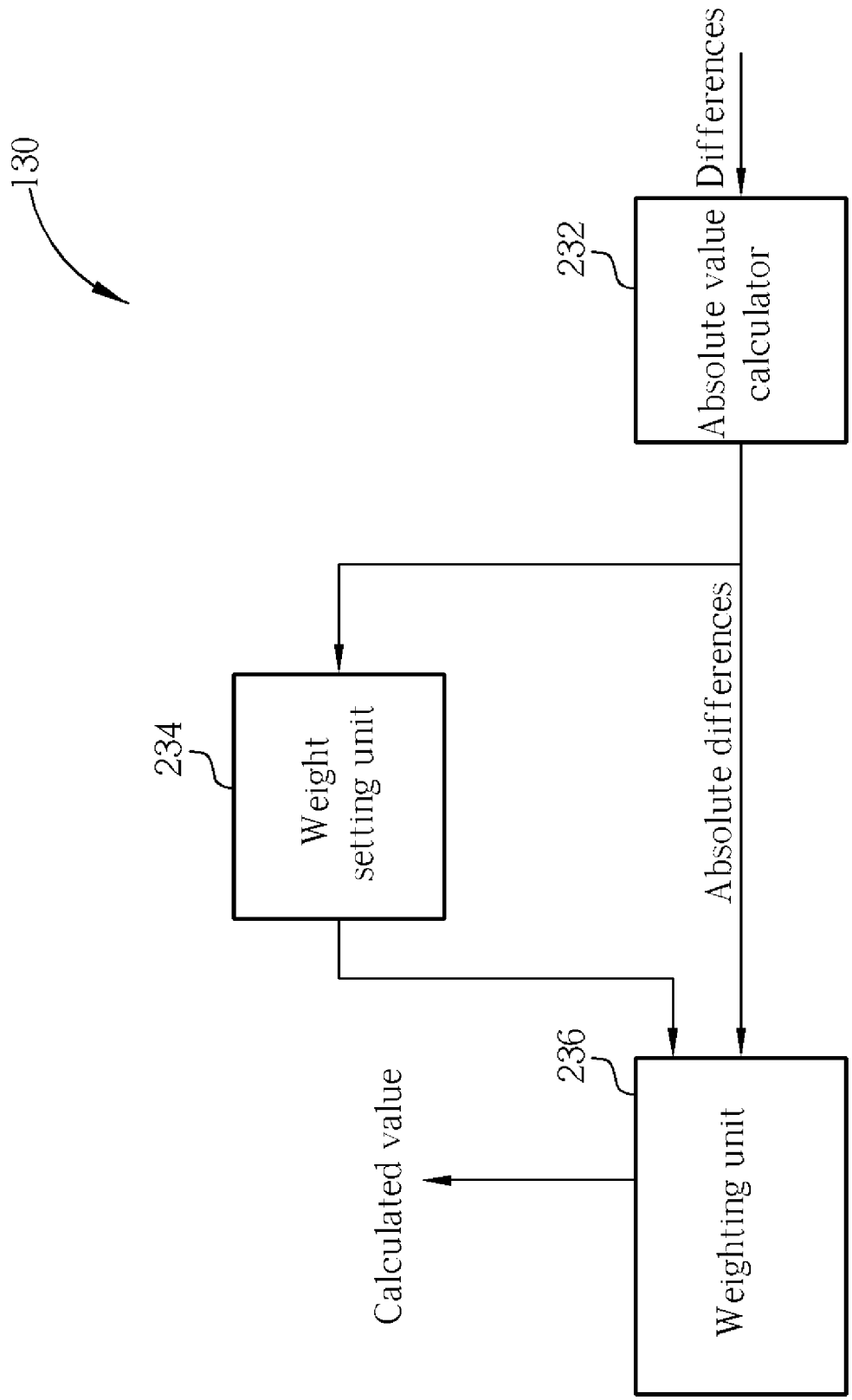
FIG. 2 is a block diagram of a computing unit of FIG. 1 according to another embodiment.

In practice, the weighting of those differences used in the calculation of the calculated value can be adjusted to achieve similar effect made by the aforementioned sum of square approach. For example, FIG. 2 shows a block diagram of the computing unit 130 according to another embodiment. As shown in FIG. 2, the computing unit 130 of this embodiment comprises an absolute value calculator 232, a weight setting unit 234, and a weighting unit 236. The absolute value calculator 232 is arranged for calculating an absolute value for each of the plurality of differences generated by the difference calculator 120 to obtain a plurality of absolute differences. The weight setting unit 234 divides the plurality of absolute differences into a plurality of intervals according to their magnitudes and assigns each interval a corresponding weight factor, wherein an interval corresponding to larger absolute differences has a greater weight factor than another interval corresponding to smaller absolute differences. Then, the weighting unit 236 performs a weighting operation on the plurality of absolute differences according to the weight factors assigned by the weight setting unit 234 to generate a calculated value corresponding to the phase of a currently used sampling clock of the sampling circuit 110. Hereinafter, the operations of the computing unit 130 will be explained in more detail.

Suppose that the plurality of differences include six differences, which are −5, 3, 90, 100, 20, and −10. In this case, the absolute value calculator 232 calculates six corresponding absolute values, which are 5, 3, 90, 110, 20, and 10. For convenience, it is assumed that the weight setting unit 234 divides these six absolute differences into 3 intervals, a first interval ranging from 0 to 85, a second interval ranging from 86 to 170, and a third interval ranging from 171 to 255. Thus, the absolute differences 3, 5, 10, and 20 are located within the first interval; the absolute difference 90 is located within the second interval; and the absolute difference 110 is located within the third interval. As described previously, the weight setting unit 234 assigns each of the three intervals a corresponding weight factor, wherein the interval corresponding to a larger absolute value has a greater weight factor than the interval corresponding to a smaller absolute value. By way of example, the weight setting unit 234 may set the weight factors of the first, second, and third intervals as 10, 30, and 50, respectively. Then, the weighting unit 236 performs the following weighting operation on the above six absolute differences according to the weight factors assigned by the weight setting unit 234 to generate a calculated value:

$$\text{calculated value} = (3+5+10+20) \times 10 + 90 \times 30 + 110 \times 50 = 380 + 2700 + 5500 = 8580 \quad \text{(formula 1)}$$

Note that the aforementioned interval division manner and the weighting formula are merely an example rather than a restriction of the practical implementations.

In this embodiment, the adjusting circuit 140 is arranged for adjusting the phase of the sampling clock of the sampling circuit 110 so that the calculated value generated by the computing unit 130 satisfies a predetermined condition. As in the foregoing descriptions, the analog-to-digital converting module 100 of this embodiment is utilized to convert analog incoming image signals into corresponding digital image data. In general, when the phase of the sampling clock employed by the sampling circuit 110 changes, the calculated value generated by the computing unit 130 changes correspondingly. In this case, the larger the calculated value, the better the phase of the sampling clock currently in use. Accordingly, the adjusting circuit 140 adjusts the phase of the sampling clock to maximize the calculated value output from the computing unit 130 in order to determine a best sampling phase of the sampling clock. For example, the adjusting circuit 140 may adjust the phase of the sampling clock by changing a delay applied to the sampling clock. In practice, the predetermined condition may be set as that the calculated value generated by the computing unit 130 have to exceed a threshold value corresponding to the minimum requirement of image quality. Thereto, multiple threshold values may be configured to meet different requirements, and the magnitude of each threshold value can be determined by the rule of thumb or by experiments.

Figure 3:
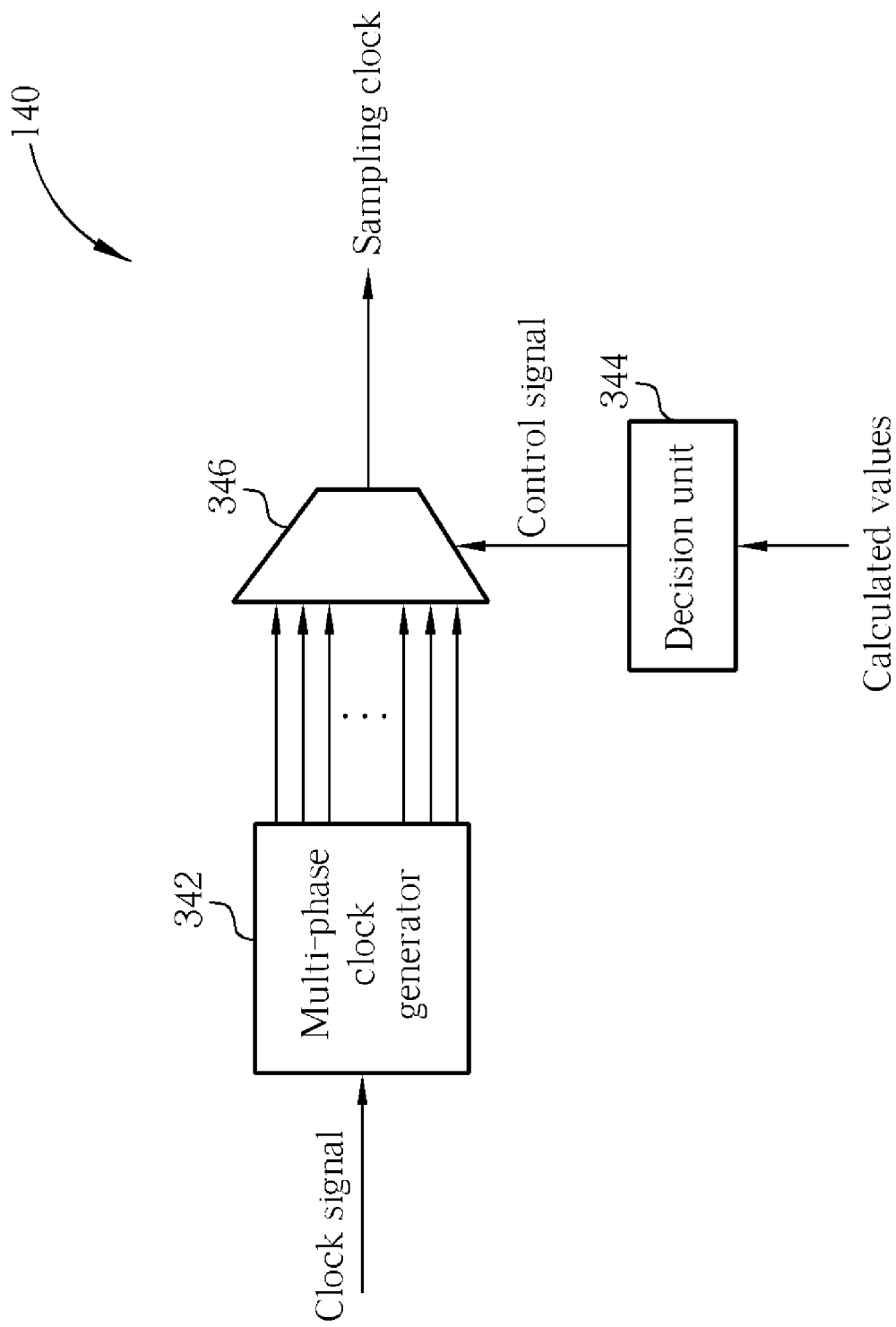
FIG. 3 is a block diagram of an adjusting circuit of FIG. 1 according to an exemplary embodiment.

FIG. 3 depicts a block diagram of the adjusting circuit 140 according to an exemplary embodiment. In this embodiment, the adjusting circuit 140 comprises a multi-phase clock generator 342 for generating a plurality of candidate sampling clocks with different phases according to a clock signal; a decision unit 344 for comparing a plurality of calculated values, which respectively correspond to the candidate sampling clocks, generated by the computing unit 130 to generate a control signal; and a selector 346 for selecting one of the candidate sampling clocks as the sampling clock of the sampling circuit 110 according to the control signal. In one embodiment, the decision unit 344 compares the calculated values to identify a maximum calculated value, and outputs a digital control value to control the selector 346 to output a candidate sampling clock corresponding to the maximum calculated value as the best sampling clock of the sampling circuit 110. In practice, the multi-phase clock generator 342 may be realized by a delay chain, and the selector 346 may be implemented with a multiplexer.

In the aforementioned phase adjustment process, the image content in the incoming signal received by the sampling circuit 110 may be general video images. In other words, the disclosed architecture for adjusting the phase of sampling clock of the sampling circuit 110 is able to adaptively adjust the sampling phase of the sampling circuit 110 according to the image pattern of the incoming signal. In practical applications, the image content in the incoming signal received by the sampling circuit 110 may be an image with a specific pattern that is properly designed for use in adjusting the sampling clock.

Note that the disclosed analog-to-digital converting module 100 is applied in an LCD device. This is merely for the sake of explanatory convenience rather than a limitation of practical applications. In practice, the input signal of the analog-to-digital converting module 100 is not limited to image signals, and that the predetermined condition that the calculated value generated by the computing unit 130 should satisfy can also be modified according to system requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sampling clock adjusting device of a sampling circuit, comprising:
    a difference calculator coupled to the sampling circuit for calculating a plurality of differences between adjacent sampled values of a plurality of sampled values, which are generated from the sampling circuit by sampling an incoming signal based on a sampling clock;
    a computing unit coupled to the difference calculator for generating a calculated value according to the plurality of differences, which include a first difference with a first absolute value and a second difference with a second absolute value less than the first absolute value, wherein the calculated value is derived from at least a first portion and a second portion, the first portion is contributed by the first difference, the second portion is contributed by the second difference, and a first ratio of the first portion to the second portion is greater than a second ratio of the first absolute value to the second absolute value; and
    an adjusting circuit coupled to the computing unit and the sampling circuit for adjusting a phase of the sampling clock so that the calculated value generated by the computing unit satisfies a predetermined condition.

2. The sampling clock adjusting device of claim 1, wherein the adjusting circuit adjusts the phase of the sampling clock to maximize the calculated value output from the computing unit.

3. The sampling clock adjusting device of claim 1, wherein the computing unit computes a sum of squares of the plurality of differences to generate the calculated value.

4. The sampling clock adjusting device of claim 1, wherein the computing unit comprises:
    an absolute value calculator for calculating an absolute value for each of the plurality of differences to obtain a plurality of absolute differences;
    a weight setting unit coupled to the absolute value calculator for dividing the plurality of absolute differences into a plurality of intervals according to their magnitudes and assigning each interval a corresponding weight factor, wherein an interval corresponding to larger absolute differences has a greater weight factor than other intervals corresponding to smaller absolute differences; and
    a weighting unit coupled to the weight setting unit for performing a weighting operation on the plurality of absolute differences according to the weight factors assigned by the weight setting unit to generate the calculated value.

5. The sampling clock adjusting device of claim 1, wherein the sampling circuit is an analog-to-digital converter.

6. The sampling clock adjusting device of claim 1, wherein the adjusting circuit comprises:
    a multi-phase clock generator for generating a plurality of candidate sampling clocks with different phases according to a clock signal;
    a decision unit coupled to the computing unit for comparing a plurality of calculated values, which respectively correspond to the candidate sampling clocks, that are generated by the computing unit to generate a control signal; and
    a selector, coupled to the multi-phase clock generator, the decision unit, and the sampling circuit, for selecting one of the candidate sampling clocks as the sampling clock according to the control signal.

7. The sampling clock adjusting device of claim 6, wherein the selector is a multiplexer.

8. The sampling clock adjusting device of claim 1, wherein the incoming signal is an image signal.

9. A method for adjusting a sampling clock of a sampling circuit, the method comprising:
    calculating a plurality of differences between adjacent sampled values of a plurality of sampled values, which are generated from the sampling circuit by sampling an incoming signal based on the sampling clock;
    performing a predetermined calculation on the plurality of differences to generate a calculated value, wherein the plurality of differences includes a first difference with a first absolute value and a second difference with a second absolute value less than the first absolute value, the calculated value is derived from at least a first portion and a second portion, the first portion is contributed by the first difference, the second portion is contributed by the second difference, and the predetermined calculation makes a first ratio of the first portion to the second portion greater than a second ratio of the first absolute value to the second absolute value; and
    adjusting a phase of the sampling clock so that the calculated value generated by the predetermined calculation satisfies a predetermined condition.

10. The method of claim 9, wherein the step of adjusting the phase of the sampling clock is performed to maximize the calculated value.

11. The method of claim 9, wherein the predetermined calculation computes a sum of squares of the plurality of differences.

12. The method of claim 9, wherein the predetermined calculation comprises:
    calculating an absolute value for each of the plurality of differences to obtain a plurality of absolute differences;
    dividing the plurality of absolute differences into a plurality of intervals according to their magnitudes and assigning each interval a corresponding weight factor, wherein an interval corresponding to larger absolute differences has a greater weight factor than other intervals corresponding to smaller absolute differences; and performing a weighting operation on the plurality of absolute differences according to their weight factors to generate the calculated value.

13. The method of claim 9, wherein the sampling circuit is an analog-to-digital converter.

14. The method of claim 9, wherein the step of adjusting the phase of the sampling clock comprises:

generating a plurality of candidate sampling clocks with different phases according to a clock signal;

comparing a plurality of calculated values corresponding to the candidate sampling clocks; and selecting one of the candidate sampling clocks as the sampling clock according to the comparison result.

15. The method of claim 9, wherein the incoming signal is an image signal.

16. An analog-to-digital converting module capable of adaptively adjusting a phase of a sampling clock, the analog-to-digital converting module comprising:

an analog-to-digital converter for sampling an incoming signal according to the sampling clock to generate a plurality of sampled values;

a difference calculator coupled to the analog-to-digital converter for calculating a plurality of differences between adjacent sampled values;

a computing unit coupled to the difference calculator for generating a calculated value according to the plurality of differences, which include a first difference with a first absolute value and a second difference with a second absolute value less than the first absolute value, wherein the calculated value is derived from at least a first portion and a second portion, the first portion is contributed by the first difference, the second portion is contributed by the second difference, and a first ratio of the first portion to the second portion is greater than a second ratio of the first absolute value to the second absolute value; and an adjusting circuit coupled to the computing unit and the analog-to-digital converter for adjusting the phase of the sampling clock so that the calculated value generated by the computing unit satisfies a predetermined condition.

17. The analog-to-digital converting module of claim 16, wherein the adjusting circuit adjusts the phase of the sampling clock to maximize the calculated value output from the computing unit.

18. The analog-to-digital converting module of claim 16, wherein the computing unit computes a sum of squares of the plurality of differences to generate the calculated value.

19. The analog-to-digital converting module of claim 16, wherein the computing unit comprises:

an absolute value calculator for calculating an absolute value for each of the plurality of differences to obtain a plurality of absolute differences;

a weight setting unit coupled to the absolute value calculator for dividing the plurality of absolute differences into a plurality of intervals according to their magnitudes and assigning each interval a corresponding weight factor, wherein an interval corresponding to larger absolute differences has a greater weight factor than other intervals corresponding to smaller absolute differences; and a weighting unit coupled to the weight setting unit for performing a weighting operation on the plurality of absolute differences according to the weight factors assigned by the weight setting unit to generate the calculated value.

20. The analog-to-digital converting module of claim 16, wherein the adjusting circuit comprises:

a multi-phase clock generator, for generating a plurality of candidate sampling clocks with different phases according to a clock signal;

a decision unit, coupled to the computing unit, for comparing a plurality of calculated values, which respectively correspond to the candidate sampling clocks, that are generated by the computing unit to generate a control signal; and a selector, coupled to the multi-phase clock generator, the decision unit, and the sampling circuit, for selecting one of the candidate sampling clocks as the sampling clock according to the control signal.

* * * * *